US011137592B2

(12) United States Patent
Lamagna et al.

(10) Patent No.: US 11,137,592 B2
(45) Date of Patent: Oct. 5, 2021

(54) MICROMECHANICAL MIRROR STRUCTURE WITH IMPROVED MECHANICAL AND REFLECTIVITY FEATURES AND CORRESPONDING MANUFACTURING PROCESS

(71) Applicant: STMicroelectronics S.r.l., Agrate Brianza (IT)

(72) Inventors: Luca Lamagna, Cassina de'Pecchi (IT); Stefano Losa, Cornaredo (IT); Silvia Rossini, Usmate Velate (IT); Federico Vercesi, Milan (IT); Elena Cianci, Cerveteri (IT); Graziella Tallarida, Bergamo (IT); Claudia Wiemer, Monza Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 134 days.

(21) Appl. No.: 16/248,379

(22) Filed: Jan. 15, 2019

(65) Prior Publication Data

US 2019/0219816 A1 Jul. 18, 2019

(30) Foreign Application Priority Data

Jan. 16, 2018 (IT) .......................... 102018000001111

(51) Int. Cl.
*G02B 26/08* (2006.01)
*G02B 1/18* (2015.01)
(Continued)

(52) U.S. Cl.
CPC ............ *G02B 26/0841* (2013.01); *B81B 1/00* (2013.01); *G02B 1/14* (2015.01); *G02B 1/18* (2015.01);
(Continued)

(58) Field of Classification Search
CPC ................ G02B 26/08; G02B 26/0841; G02B 26/0833; G02B 26/085; G02B 26/10;
(Continued)

(56) References Cited

U.S. PATENT DOCUMENTS

| 6,893,578 | B1* | 5/2005 | Clews | ................. | B81C 1/00595 |
| | | | | | 216/102 |
| 7,573,634 | B2* | 8/2009 | Schmidt | ................... | G02B 5/08 |
| | | | | | 359/224.1 |

(Continued)

OTHER PUBLICATIONS

IT Search Report and Written Opinion for IT Appl. No. 102018000001111 dated Sep. 12, 2018 (9 pages).
Berdova Maria: "Protective coatings of hafnium dioxide by atomic layer deposition for microelectromechanical systems applications" Applied Surface Science, Elsevier, Amsterdam, NL, 2016 (8 pages).

(Continued)

*Primary Examiner* — Jie Lei
(74) *Attorney, Agent, or Firm* — Crowe & Dunlevy

(57) ABSTRACT

A micromechanical mirror structure includes a mirror element designed to reflect an incident light radiation and a protective structure arranged over the mirror element to provide mechanical protection for the mirror element and to increase the reflectivity of the mirror element with respect to the incident light radiation. The protective structure has a first protective layer and a second protective layer which are stacked on the mirror element. The second protective layer is arranged on the first protective layer and the first protective layer is arranged on the mirror element. The layers include a respective dielectric material and having respective refractive indexes that jointly increase the reflectivity of the mirror element in a range of wavelengths of interest.

17 Claims, 4 Drawing Sheets

(51) Int. Cl.
  *G02B 1/14* (2015.01)
  *B81B 1/00* (2006.01)
  *G02B 5/08* (2006.01)

(52) U.S. Cl.
  CPC ....... *G02B 5/0858* (2013.01); *G02B 26/0833* (2013.01)

(58) Field of Classification Search
  CPC ...... G02B 26/105; G02B 5/08; G02B 5/0858; G02B 5/0808; G02B 5/0825; G02B 1/14; G02B 1/18; B81B 1/00
  USPC ..... 359/223.1, 359, 586, 584, 589, 884, 904
  See application file for complete search history.

(56) References Cited

U.S. PATENT DOCUMENTS

2014/0099451 A1* 4/2014 Mahieu ................ C03C 17/245
                                                    427/576
2015/0055203 A1  2/2015 Maruyama et al.

OTHER PUBLICATIONS

Zanuccoli M.: "Simulation of micro-mirrors for optical MEMS", 2013 International Conference on Simulation of Semiconductor Processes and Devices (5 pages).
Sandner, T.: "Highly reflective optical coatings for high power applications of micro scanning mirrors in the UV-VIS-NIR spectral region", SPIE, PO Box 10 Bellingham WA, 2006 (16 pages).

* cited by examiner

MICROMECHANICAL MIRROR STRUCTURE WITH IMPROVED MECHANICAL AND REFLECTIVITY FEATURES AND CORRESPONDING MANUFACTURING PROCESS

PRIORITY CLAIM

This application claims the benefit and priority of Italian Application for Patent No. 102018000001111, filed on Jan. 16, 2018, the content of which is hereby incorporated by reference in its entirety to the maximum extent allowable by law.

TECHNICAL FIELD

This disclosure relates to a micromechanical mirror structure with improved mechanical and reflectivity features, as well as to a corresponding manufacturing process.

BACKGROUND

Micromechanical mirror structures are made, at least in part, from semiconductor materials and using micro-electromechanical systems (MEMS) technology. Such micromechanical mirror structures are used in optoelectronic devices for directing light radiation beams generated by a light source, such as laser beams, according to desired modalities. Thanks to the reduced dimensions, micromechanical mirror structures make it possible to meet stringent requirements regarding space occupation, in terms of area and thickness.

For instance, micromechanical mirror structures are used in miniaturized projector modules (e.g., picoprojectors), which are able to project images at a distance or generate desired patterns of light for portable electronic apparatuses, such as laptops, tablets, phablets, or smartphones, or in automotive lighting systems.

The aforesaid micromechanical mirror structures generally include a mobile element, made from a semiconductor material body and elastically supported so as to have, for example, a tilting or rotation movement; the mobile element carries, on a top surface thereof, a mirror element designed to direct in a desired way an incident light beam generated by an appropriate light source.

The mirror element is made of a layer of a suitable material, such as metal, having a high reflectivity and a low absorption of the incident light within a desired range of wavelengths.

A material commonly used for the mirror element is aluminum due to its high reflecting properties and low cost. However, it has been found that aluminum layers are readily subject to oxidation and mechanical degradation, especially in environments in which a high degree of humidity is present.

Consequently, it has been proposed to provide a protective coating on the mirror element and on the corresponding layer of reflecting material.

Such a protective coating, in addition to providing the desired protection, in particular from humidity or other causes of mechanical degradation, should have a high reflectivity in order not to jeopardize the mirror functions.

Known approaches include forming the aforesaid protective coating with a layer of dielectric material, for example, silicon oxide $SiO_2$, having an appropriate thickness. The advantage of this material is that it is commonly used in the manufacturing of semiconductor structures, and thus may be readily integrated in the manufacturing process.

However, it has been found that a layer of dielectric material on the mirror element, although providing an adequate mechanical protection, might not reach the desired reflectivity performance.

SUMMARY

In an embodiment, a micromechanical mirror structure comprises: a mirror element configured to reflect incident light radiation; and a protective structure arranged over the mirror element and configured to provide mechanical protection for the mirror element and to increase reflectivity of the mirror element with respect to the incident light radiation; wherein the protective structure comprises first and second protective layers stacked on the mirror element, with the second protective layer arranged on the first protective layer and the first protective layer arranged on the mirror element, the first and second protective layers being comprised of a respective dielectric material and having respective refractive indexes so as to jointly increase the reflectivity of the mirror element in a given range of wavelengths.

In an embodiment, an optoelectronic device comprises: a body having a cavity defined therein; a mobile mass suspended above the cavity; and a micromechanical mirror structure carried by the mobile mass and comprising: a mirror element configured to reflect incident light radiation; and a protective structure arranged over the mirror element and configured to provide mechanical protection for the mirror element and to increase reflectivity of the mirror element with respect to the incident light radiation; wherein the protective structure comprises first and second protective layers stacked on the mirror element, with the second protective layer arranged on the first protective layer and the first protective layer arranged on the mirror element, the first and second protective layers being comprised of a respective dielectric material and having respective refractive indexes so as to jointly increase the reflectivity of the mirror element in a given range of wavelengths.

In an embodiment, a method for manufacturing a micromechanical mirror structure comprises: forming a mirror element to reflect an incident light radiation; and forming a protective structure arranged over the mirror element and configured to provide mechanical protection for the mirror element and to increase reflectivity of the mirror element with respect to the incident light radiation. The forming of the protective structure comprises: depositing a first protective layer on the mirror element; and depositing a second protective layer on the first protective layer; wherein the first and second protective layers comprise a dielectric material with a respective refractive index that jointly increases the reflectivity of the mirror element in a range of wavelengths of interest.

BRIEF DESCRIPTION OF THE DRAWINGS

For a better understanding embodiments are now described, purely by way of non-limiting example, with reference to the attached drawings, wherein.

DETAILED DESCRIPTION

As will be clarified in detail hereinafter, an aspect envisages providing a protective structure coating the mirror element of the micromechanical structure so as to provide a mechanical protection from humidity or other causes of degradation, and also such as to improve the reflectivity properties of the mirror element with respect to incident light radiation, in a desired range of wavelengths.

The protective structure is provided by a stack of two layers of appropriate material, for example dielectric material, one having a high refractive index and the other having a low refractive index, in the range of wavelengths of interest. This protective structure enables a significant increase of the reflectivity of the mirror element (as will be seen hereinafter, a reflectivity higher than that of a single layer, for example an aluminum layer, is achieved), via an appropriate choice of the thickness and composition of the layers in the stack.

Figure 1:
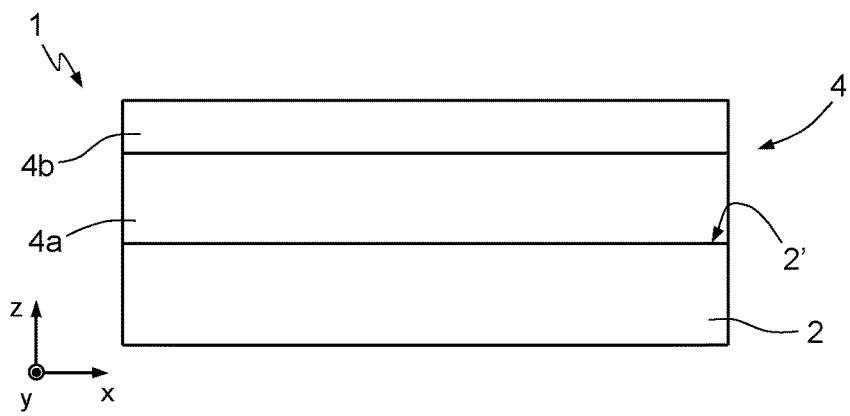
FIG. 1 is a schematic cross-sectional view of a portion of a micromechanical mirror structure, according to one embodiment.

In one embodiment, represented schematically in FIG. 1, the micromechanical mirror structure 1 (a portion of which is illustrated by way of example) thus comprises: a mirror element 2, constituted by a layer of metal material and having a reflecting surface 2' lying in a horizontal plane xy; and a protective structure 4, which is arranged over the reflecting surface 2' so as to cover and coat, preferably but not necessarily completely, the mirror element 2, and has the dual function of offering a mechanical protection, for example from humidity, and of enhancing the optical properties of reflectivity of the mirror element 2 with respect to incident light radiation.

In the embodiment described, the range of wavelengths of interest substantially coincides with visible light, being comprised between 400 nm and 700 nm.

The mirror element 2 is constituted by a layer of aluminum, in particular an aluminum-copper alloy, AlCu, with a concentration of copper of 0.5%, having a thickness, for example, comprised between 50 nm and 500 nm.

The protective structure 4 comprises a stack formed by a first protective layer 4a and a second protective layer 4b, stacked on top of one another (with the second protective layer 4b arranged on the first protective layer 4a) on the mirror element 2, both of which are made of dielectric material. The first protective layer 4a is thus arranged on top of the mirror element 2, whereas the second protective layer 4b is separated from the mirror element 2 itself by the first protective layer 4a.

In detail, the first protective layer 4a is constituted by a layer of silicon dioxide, $SiO_2$, having a thickness (in the vertical direction of stacking, transverse to the reflecting surface 2' of the mirror element 2 and to the horizontal plane xy, along the axis z in FIG. 1) comprised between 76 nm and 114 nm, preferably equal to 95 nm. The first protective layer 4a further has a refractive index $n_1$ of 1.47 at a wavelength of 630 nm.

The second protective layer 4b is constituted by a layer of hafnium dioxide, $HfO_2$, having a thickness (in the aforesaid vertical direction) comprised between 40 nm and 60 nm, preferably equal to 50 nm. The second protective layer 4b has a respective refractive index $n_2$ of 1.91 at the wavelength of 630 nm, which is higher than the refractive index $n_1$ of the aforesaid first protective layer 4a.

Figure 2A:
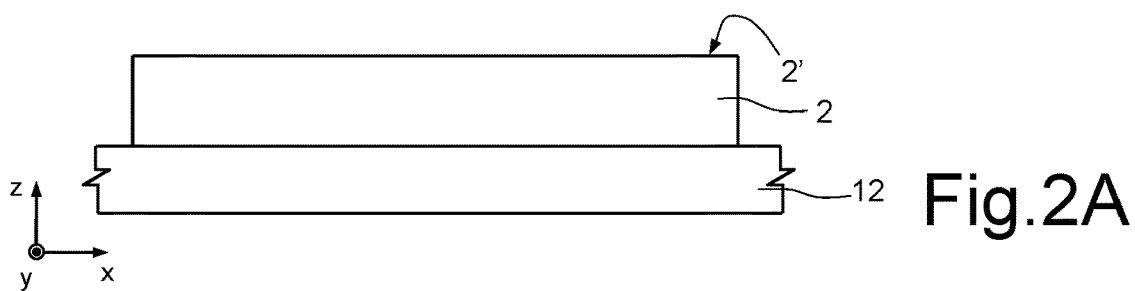
FIGS. 2A-2C are schematic cross-sectional views of the structure of FIG. 1, in successive steps of a corresponding manufacturing process.

The process for manufacturing the micromechanical structure 1 envisages, with regard to the portion described, first the formation of the aluminum layer of the mirror element 2, via physical vapor deposition (PVD) at a temperature of 50° C., as illustrated schematically in FIG. 2A.

As will be clear, the mirror element 2 may, for example, be deposited on a mobile mass, represented schematically herein and designated by 12, of the micromechanical mirror structure 1, which is designed to carry the mirror element 2 and enable movement thereof via rotation and/or tilting to orient appropriately the reflected light radiation.

Figure 2B:
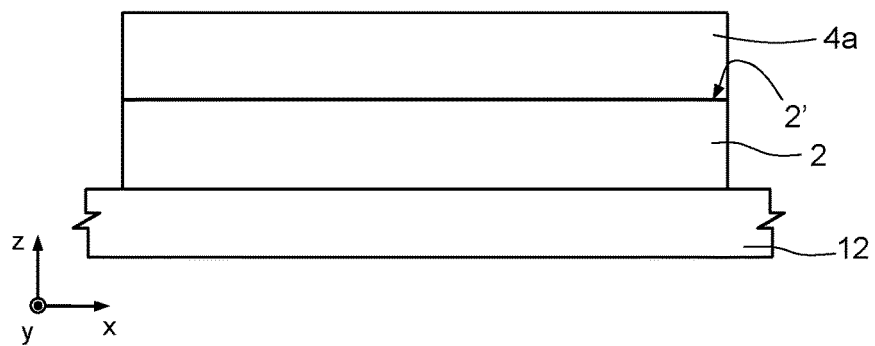

Next, the manufacturing process envisages formation of the first protective layer 4a, in particular via plasma-enhanced chemical vapor deposition (PECVD), at a temperature of growth comprised in the range between 125° C. and 200° C., preferably equal to 175° C. This first protective layer 4a is arranged on the mirror element 2, as illustrated schematically in FIG. 2B.

Figure 2C:
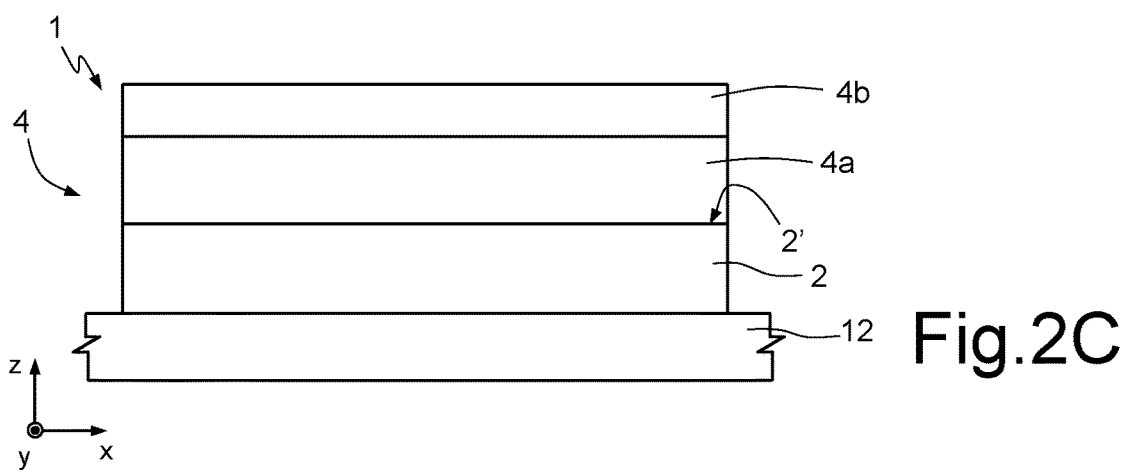

Next, as illustrated schematically in FIG. 2C, the second protective layer 4b is formed, stacked on the first protective layer 4a, in particular via atomic-layer deposition (ALD), at a temperature of growth in the range between 125° C. and 200° C., preferably equal to 175° C., using tetrakis-ethyl-methylaminohafnium $(4[(C_2H_5)(CH_3)N]Hf$-TEMAHf) and $O_3$ as precursors of hafnium and oxygen, respectively.

The aforesaid process affords the following advantages: a high control of thickness and uniformity of deposition of the layers; a high control of homogeneity of the refractive index of the first and second protective layers 4a, 4b; and the deposition of amorphous films. Furthermore, the deposited layers have a low roughness, with an RMS value of surface roughness of less than 2 nm.

Through experimental tests, it has been found that the protective structure 4, constituted by stacking of the first and second protective layers 4a, 4b, enables a considerable increase in the reflectivity of the mirror element 2 over the entire range of wavelengths of interest. In particular, it is possible to obtain a value of reflectivity higher than 90% in the range of wavelength comprised between 420 nm and 675 nm (corresponding to a total bandwidth of 255 nm).

This enables significant increases in reflectivity to be obtained as compared to the prior art utilizing coating of the mirror element with a single layer of dielectric material.

Figure 3A:
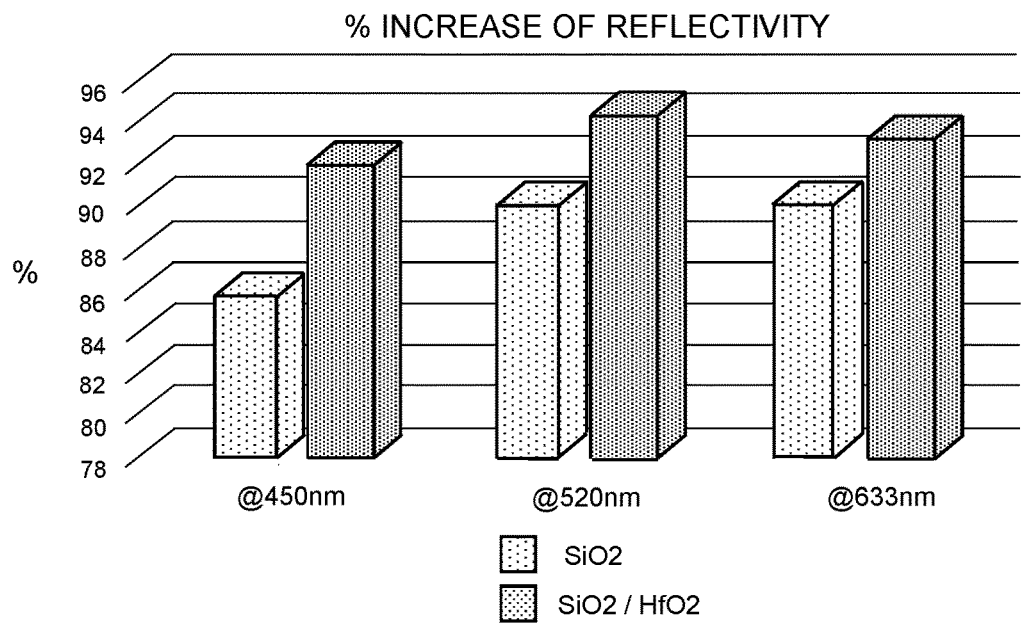
FIGS. 3A-3B show plots regarding the reflectivity performance of the structure of FIG. 1 as compared to a prior art structure.
Figure 3B:
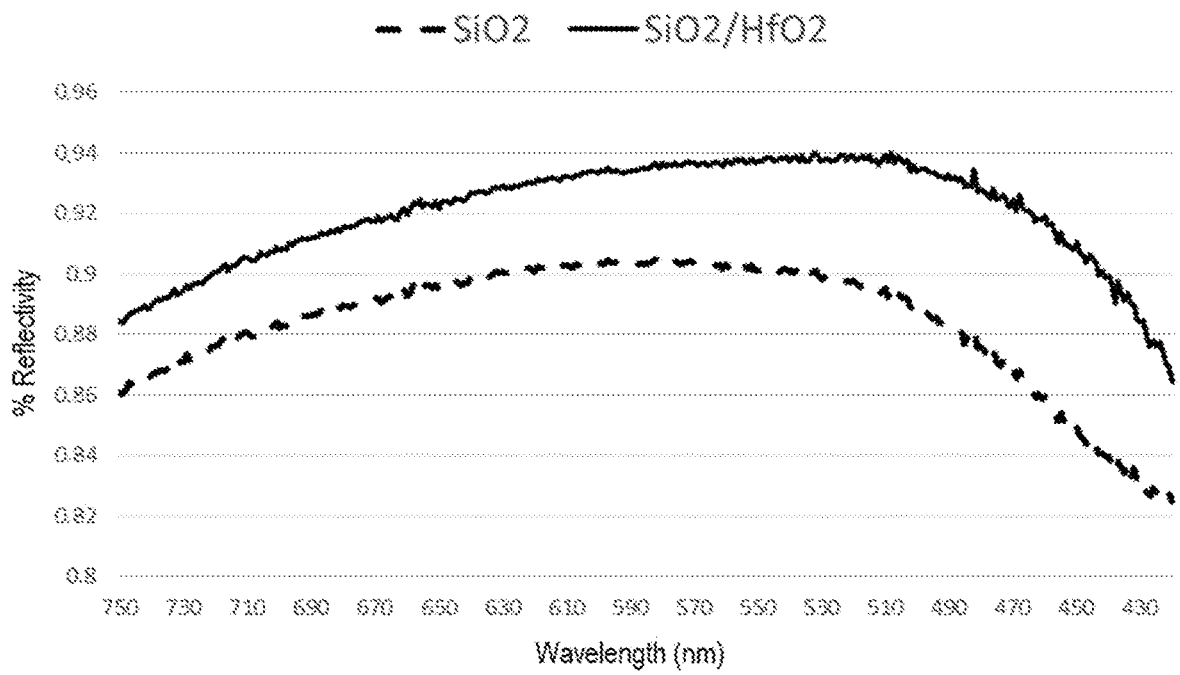

In this regard, FIGS. 3A and 3B show the percentage increase of reflectivity that may be obtained compared with the increase that may be obtained by coating the mirror element 2 with a single layer of $SiO_2$ (having a thickness of 200 nm).

In the example illustrated, as compared to the prior art, a minimum percentage increase of: 6.2% at a wavelength of 450 nm; 4.2% at a wavelength of 520 nm; and 2.8% at a wavelength of 633 nm (these indicative values clearly depend on the testing parameters and conditions, in any case being representative of the increase in performance achieved thanks to the present solution) may be obtained.

As highlighted by the plot of FIG. 3B, which once again refers to the tests conducted that confirm the percentage increase in reflectivity as compared to the prior art is advantageously present over the entire range of wavelengths of interest.

It has further verified that, in conditions of stress in terms of temperature and humidity, the validity over time of the mechanical protection and maintenance of the optical features provided by the protective structure 4 (among others, with tests conducted for a duration of 168 h and 500 h at a temperature of 85° C.) persists.

Figure 4:
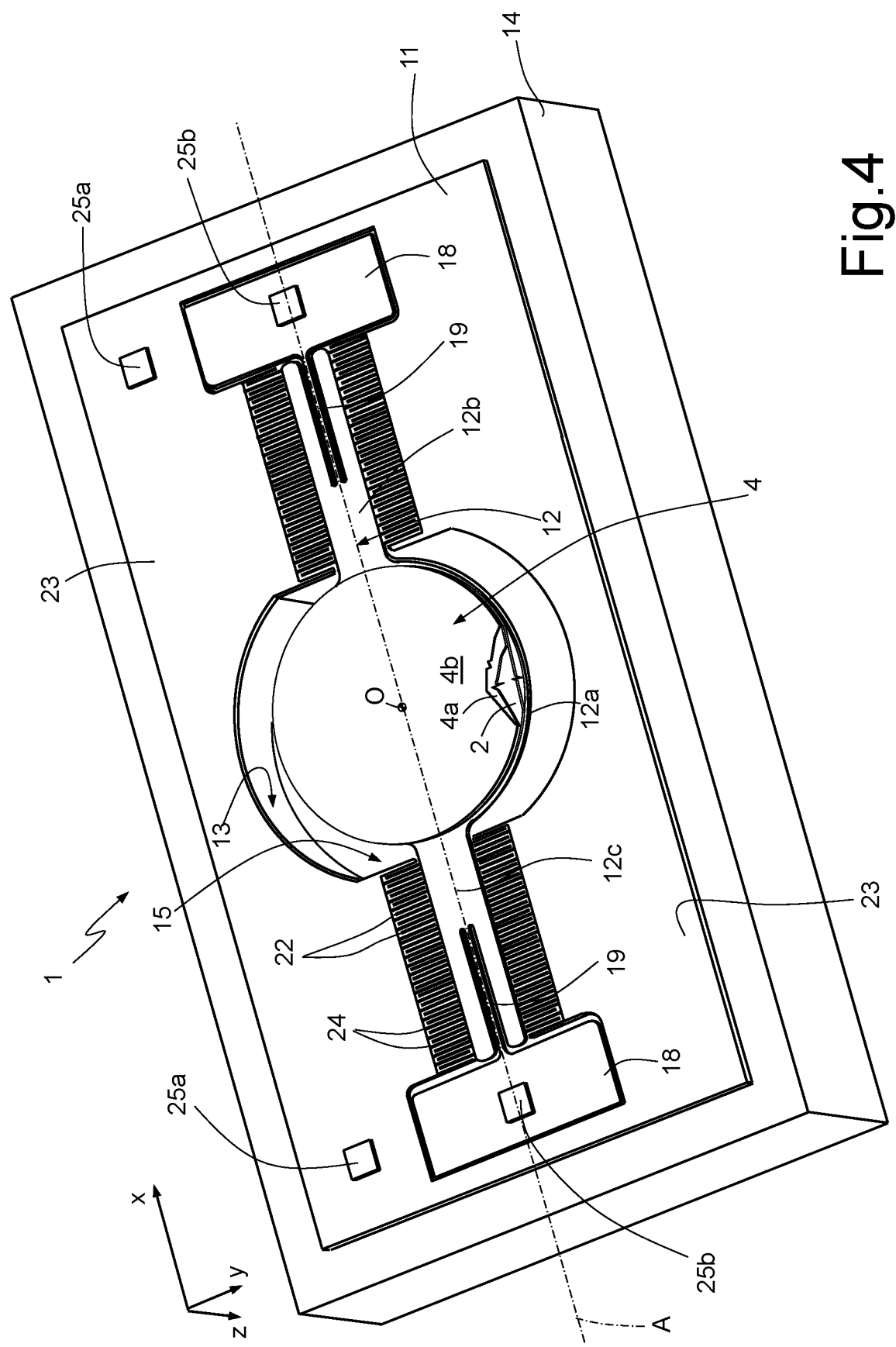
FIG. 4 shows in greater detail a possible embodiment of a micromechanical mirror structure.

With reference to FIG. 4, a more detailed description of a possible embodiment of the micromechanical mirror structure 1 is now presented, including the protective structure 4 on the corresponding mirror element 2.

The micromechanical mirror structure 1 in this case comprises: a first body of semiconductor material 11, for example, silicon, in which a mobile mass 12, surrounded by a trench 13, is provided, for example by removal of material via chemical etching.

The micromechanical mirror structure 1 further comprises a second body 14 of semiconductor material, for example, silicon, coupled to the first body 11, in which a cavity 15 is formed, for example via removal of material with deep dry chemical etching.

The mobile mass 12 is suspended above the cavity 15 and, in a condition at rest, is arranged substantially parallel to and facing a bottom wall of the cavity 15.

The mobile mass 12 has a central portion 12a, in the example having a circular shape in plan view (in the horizontal plane xy), arranged on which is the mirror element 2, coated, as described previously, by the protective structure 4. The mobile mass 12 further has end portions 12b, 12c, having an elongated shape and extend on opposite sides with respect to the central portion 12a along a first horizontal axis x of the horizontal plane xy.

The mobile mass 12 is coupled, at the end portions 12b, 12c, to anchorages 18, fixed with respect to the second body 14, by elastic elements 19, of a torsional type, which enable rotation of the same mobile mass 12 out of the horizontal plane xy. The elastic elements 19 define, in their direction of extension and alignment, an axis of rotation A for the mobile mass 12, passing through the geometrical center O of the central portion 12a of the same mobile mass 12.

In the example illustrated, movement of the mobile mass 12 is obtained by electrostatic actuation. The aforesaid end portions 12b, 12c thus fixedly carry finger-shaped mobile electrodes 22, which extend in the horizontal plane xy on opposite sides of the end portions 12b, 12c along the second horizontal axis y and within the trench 13.

The micromechanical mirror structure 10 further comprises a fixed portion 23, which is provided in the first body 11, is fixed with respect to the second body 14, and is separated from the mobile mass 12 by the trench 13. The fixed portion 23 carries fixed electrodes 24, which are also finger-shaped and extend longitudinally along the second horizontal axis y within the trench 13, in a position facing, and comb-fingered with, the mobile electrodes 22.

First contact pads 25a and second contact pads 25b are carried by respective top surfaces of the fixed portion 23 and of the anchorages 18, for electrical biasing, respectively, of the fixed electrodes 24 and of the mobile electrodes 22.

During operation, application of a voltage difference between the mobile electrodes 22 and the fixed electrodes 24 causes torsion of the elastic elements 19 and rotation of the mobile mass 12 (and of the associated mirror element 2) out of the horizontal plane xy about the axis of rotation A, according to the desired movement for reflecting an incident light beam, toward the outside of the micromechanical mirror structure 1.

Figure 5:
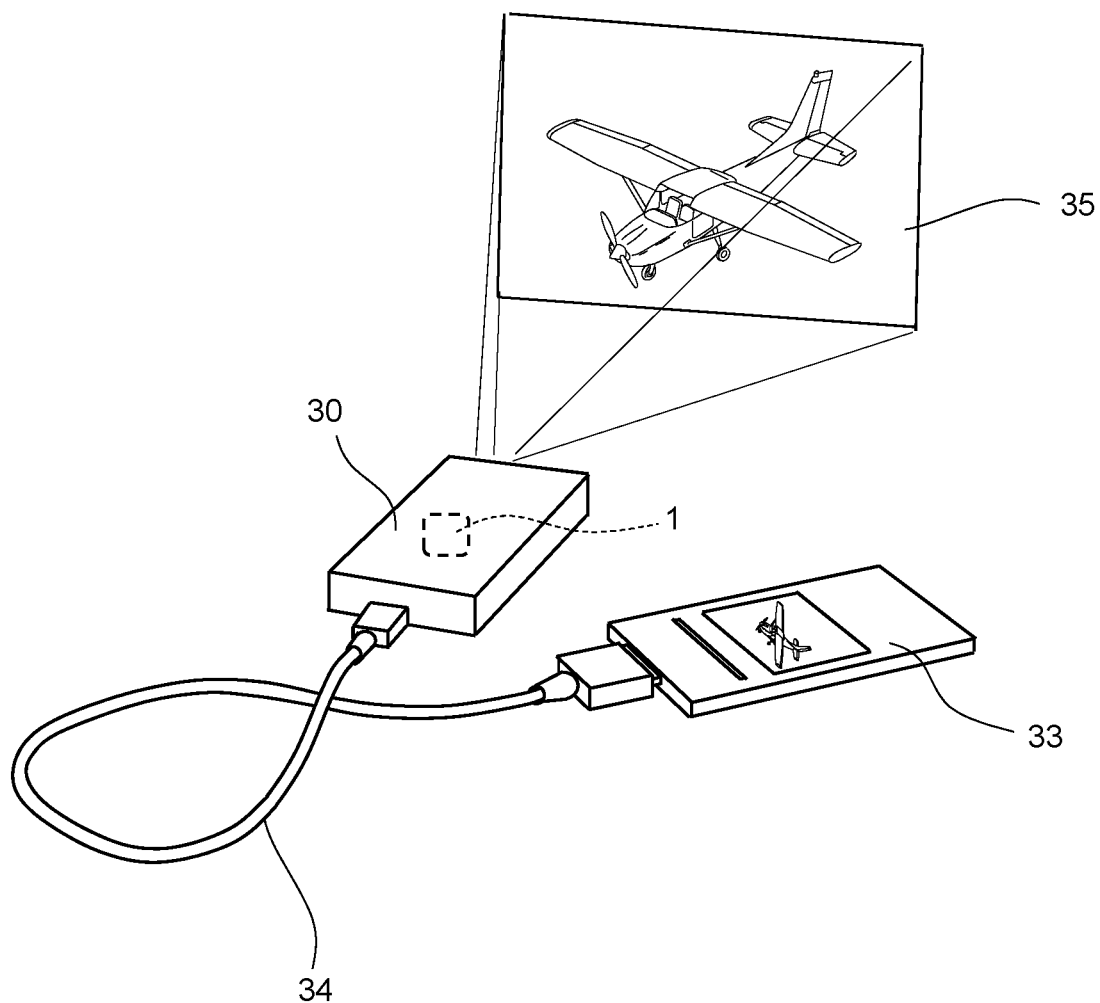
FIG. 5 shows an optoelectronic device in which the micromechanical mirror structure may be integrated.

FIG. 5 shows, schematically and purely by way of example, use of the micromechanical mirror structure 1 in an optoelectronic device 30, in particular a picoprojector module associated to a portable electronic apparatus 33 (in the example, a smartphone). In this case, the picoprojector module is provided as separate and stand-alone accessory with respect to the associated portable electronic apparatus 33, being coupled to the portable electronic apparatus 33 by appropriate electrical-connection elements 34. In particular, the micromechanical mirror structure 1 is driven so as to project the light beam generated by a light source, for example, a coherent light source of a laser type, according to a desired scanning pattern on a display surface 35 (which is external and is arranged at a distance from the picoprojector module), for example, on a screen. Alternatively, the picoprojector module 30 could be integrated within the portable electronic apparatus 33.

The advantages of the disclosures contained herein emerge clearly from the foregoing description.

In any case, it is underlined that the embodiments described allow obtainment of mechanical protection of the mirror element 2 of the micromechanical mirror structure 1, for example, preventing oxidation thereof due to humidity or other causes of mechanical degradation, while at the same time optimizing the reflectivity properties. In particular, this allows achievement of a considerable increase in reflectivity, higher than 90% over an entire range of wavelengths of interest (in the example discussed, substantially corresponding to the range of visible light).

The manufacturing process to obtain the micromechanical mirror structure 1, for production of the protective structure 4, involves processing steps (in particular, deposition of dielectric material) that are widely used in the processing of semiconductor materials, guaranteeing an excellent control of the chemico-physical properties. In particular, formation of the aforesaid protective structure 14 may be carried out by final steps, the so-called front-end steps, of the manufacturing process, without thus entailing a substantial modification of the other manufacturing steps of the micromechanical mirror structure 1.

As indicated previously, the micromechanical mirror structure 1 may thus advantageously be integrated, for example, in portable electronic devices or in optoelectronic systems for automotive lighting applications.

Finally, it is clear that modifications and variations may be made to what has been described and illustrated herein, without thereby departing from the scope of this disclosure, as defined in the appended claims.

In particular, it is underlined that the shape and surface area of the mirror element 2, and in general the conformation of the micromechanical mirror structure 1, may vary according to the application and the optical requirements. Furthermore, actuation of the mobile mass 12 of the micromechanical mirror structure 1 may be obtained with modalities different from what has been illustrated previously by way of example. For instance, actuation could be of an electromagnetic or piezoelectric nature and take place in a resonance or quasi-static, condition.

It is further highlighted that the protective structure 4 may include a higher number of protective layers, periodically repeated in the stacked structure, appropriately alternating layers with high and low optical density (i.e., with high or low refractive index). Via an appropriate choice of the thicknesses of the layers and of their composition, it could in this case be possible to obtain the desired increase in reflectivity in the wavelength range of interest, at the expense, however, of an increase in complexity of the manufacturing process and in the associated production costs. The embodiment described previously, which envisages just two protective layers in the stacked structure, is, thus, particularly advantageous.

Furthermore, as has on the other hand already been emphasized previously, the micromechanical mirror structure 1 may in general be used for any optical system and portable apparatus that requires reflection of a light beam with low occupation of space and high reflectivity.

The invention claimed is:

1. A micromechanical mirror structure, comprising:
a mirror element configured to reflect incident light radiation; and
a protective structure arranged over the mirror element and configured to provide mechanical protection for the mirror element and to increase reflectivity of the micromechanical mirror structure with respect to the incident light radiation;
wherein the protective structure consists of first and second protective layers stacked on the mirror element, with the second protective layer arranged on the first protective layer and the first protective layer arranged on the mirror element, the first and second protective layers being comprised of a respective dielectric material and having respective refractive indexes so as to increase the reflectivity of the micromechanical mirror structure in a given range of wavelengths;
wherein the first protective layer consists of a layer of silicon dioxide ($SiO_2$) having a thickness of between 76 nm and 114 nm; and
wherein the second protective layer consists of a layer of hafnium dioxide ($HfO_2$) having a thickness of between 40 nm and 60 nm.

2. The micromechanical mirror structure according to claim 1, wherein the given range of wavelengths is between 400 nm and 700 nm.

3. The micromechanical mirror structure according to claim 1, wherein the first protective layer has a thickness of 95 nm; and wherein the second protective layer has a thickness of 50 nm.

4. The micromechanical mirror structure according to claim 1, wherein the first protective layer has a refractive index of 1.47 at a wavelength of 630 nm; and wherein the second protective layer has a refractive index of 1.91 at the wavelength of 630 nm.

5. The micromechanical mirror structure according to claim 1, wherein the second protective layer has a refractive index higher than a refractive index of the first protective layer.

6. The micromechanical mirror structure according to claim 1, wherein the protective structure is configured to increase the reflectivity of the micromechanical mirror structure to an overall value of reflectivity higher than 90% within a range of wavelengths between 420 nm and 675 nm.

7. The micromechanical mirror structure according to claim 1, wherein the mirror element comprises a layer of an aluminum-copper alloy with a concentration of copper of 0.5%.

8. The micromechanical mirror structure according to claim 1, further comprising a mobile mass carrying the mirror element and actuatable to reflect the incident light radiation, the mobile mass being suspended above a cavity provided in a body including semiconductor material.

9. An optoelectronic device, comprising:
a body having a cavity defined therein;
a mobile mass suspended above the cavity; and
a micromechanical mirror structure carried by the mobile mass and comprising:
a mirror element configured to reflect incident light radiation; and
a protective structure arranged over the mirror element and configured to provide mechanical protection for the mirror element and to increase reflectivity of the micromechanical mirror structure with respect to the incident light radiation;
wherein the protective structure consists of first and second protective layers stacked on the mirror element, with the second protective layer arranged on the first protective layer and the first protective layer arranged on the mirror element, the first and second protective layers being comprised of a respective dielectric material and having respective refractive indexes so as to increase the reflectivity of the micromechanical mirror structure in a given range of wavelengths;
wherein the first protective layer consists of a layer of silicon dioxide ($SiO_2$) having a thickness of between 76 nm and 114 nm; and
wherein the second protective layer consists of a layer of hafnium dioxide ($HfO_2$) having a thickness of between 40 nm and 60 nm.

10. The optoelectronic device according to claim 9, wherein the given range of wavelengths is between 400 nm and 700 nm.

11. The optoelectronic device according to claim 9, wherein the first protective layer has a thickness of 95 nm; and wherein the second protective layer has a thickness of 50 nm.

12. The optoelectronic device according to claim 9, wherein the first protective layer has a refractive index of 1.47 at a wavelength of 630 nm; and wherein the second protective layer has a refractive index of 1.91 at the wavelength of 630 nm.

13. The micromechanical mirror structure according to claim 9, wherein the second protective layer has a refractive index higher than a refractive index of the first protective layer.

14. A method for manufacturing a micromechanical mirror structure, the method comprising:
forming a mirror element to reflect an incident light radiation; and
forming a protective structure arranged over the mirror element and configured to provide mechanical protection for the mirror element and to increase reflectivity of the micromechanical mirror structure with respect to the incident light radiation;
wherein forming the protective structure comprises:
depositing a first protective layer on the mirror element, wherein depositing the first protective layer comprises performing a plasma-enhanced chemical vapor deposition (PECVD) at a temperature of growth in a range between 125° C. and 200° C.; and
depositing a second protective layer on the first protective layer, wherein depositing the second protective layer comprises performing an atomic-layer deposition (ALD) at a temperature of growth in a range of 125° C. to 200° C., using tetrakis-ethylmethylaminohafnium ($4[(C_2H_5)(CH_3)N]Hf$—TEMAHf) and ozone ($O_3$) as precursors of hafnium and oxygen, with a result of deposition of the second protective layer being that that the second protective layer has a surface roughness with a root-mean-square (RMS) value of less than 2 nm;
wherein the first and second protective layers comprise a dielectric material with a respective refractive index that increases the reflectivity of the micromechanical mirror structure in a range of wavelengths of interest.

15. The method according to claim 14, wherein the first protective layer comprises a layer of silicon dioxide ($SiO_2$)

having a thickness of between 76 nm and 114 nm; and wherein the second protective layer comprises a layer of hafnium dioxide (HfO$_2$) having a thickness of between 40 nm and 60 nm.

16. The method according to claim 14, wherein the temperature of growth is 175° C.

17. The method according to claim 14, wherein the mirror element comprises a layer of an aluminum-copper alloy, with a concentration of copper of 0.5%; and wherein forming the mirror element comprises performing physical vapor deposition (PVD) at a temperature of 50° C.

* * * * *